US010020194B2

(12) United States Patent
Tian

(10) Patent No.: US 10,020,194 B2
(45) Date of Patent: Jul. 10, 2018

(54) LASER ANNEALING DEVICE, PRODUCTION PROCESS OF POLYCRYSTALLINE SILICON THIN FILM, AND POLYCRYSTALLINE SILICON THIN FILM PRODUCED BY THE SAME

(71) Applicant: BOE Technology Group Co., Ltd., Beijing (CN)

(72) Inventor: Xueyan Tian, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 99 days.

(21) Appl. No.: 14/761,998

(22) PCT Filed: Dec. 29, 2014

(86) PCT No.: PCT/CN2014/095313
§ 371 (c)(1),
(2) Date: Jul. 20, 2015

(87) PCT Pub. No.: WO2015/139498
PCT Pub. Date: Sep. 24, 2015

(65) Prior Publication Data
US 2016/0254151 A1 Sep. 1, 2016

(30) Foreign Application Priority Data

Mar. 17, 2014 (CN) .......................... 2014 1 0099177

(51) Int. Cl.
H01L 21/02 (2006.01)
H01L 21/268 (2006.01)
(Continued)

(52) U.S. Cl.
CPC .... H01L 21/02686 (2013.01); B23K 26/0006 (2013.01); B23K 26/0066 (2013.01);
(Continued)

(58) Field of Classification Search
CPC .. H01L 21/02675–21/02686; H01L 21/02532; H01L 21/02592; H01L 21/268; H01L 21/67115; H01L 27/1274
See application file for complete search history.

(56) References Cited

U.S. PATENT DOCUMENTS 6,897,963 B1* 5/2005 Taniguchi ........... G03F 7/70716
356/500
6,943,086 B2* 9/2005 Hongo ............... B23K 26/0648
219/121.76
(Continued)

FOREIGN PATENT DOCUMENTS

CN 1641844 A 7/2005
CN 1649109 A 8/2005
(Continued)

OTHER PUBLICATIONS

Second Office Action for Chinese Patent Application No. 201410099177.1, dated Apr. 13, 2016, 6 pages.
(Continued)

Primary Examiner — Bac Au
(74) Attorney, Agent, or Firm — Westman, Champlin & Koehler, P.A.

(57) ABSTRACT

The invention relates to the field of laser annealing, and discloses a laser annealing device, a production process of a polycrystalline silicon thin film, and a polycrystalline silicon thin film produced by the same. The laser annealing device comprises an annealing chamber, in which a laser generator is provided, wherein an annealing window, through which the laser passes, and two light-cutting plates oppositely provided above the annealing window are also provided in the annealing chamber, wherein the light-cutting end face of each of the light-cutting plates is a wedge-shaped end face. In technical solutions of the invention, since the light-cutting end face is a wedge-shaped end face, the included angle
(Continued)

formed by the reflected beam, which is formed by the reflection of the incident beam arriving at the light-cutting end face, and the ingoing beam, which passes through the annealing window, is relatively large, and the vibrating directions of them differ relatively greatly. Hence, the phenomenon of interference will hardly occur, and thus the interference mura generated on the polycrystalline silicon thin film due to the interference is reduced, the quality of the polycrystalline silicon thin film is improved, and the percent of pass of the product is also increased.

7 Claims, 1 Drawing Sheet

(51) Int. Cl.
*B23K 26/00* (2014.01)
*H01L 21/67* (2006.01)
*H01L 27/12* (2006.01)
*B23K 26/12* (2014.01)
*B23K 26/066* (2014.01)

(52) U.S. Cl.
CPC .... *H01L 21/0268* (2013.01); *H01L 21/02422* (2013.01); *H01L 21/02532* (2013.01); *H01L 21/02592* (2013.01); *H01L 21/02675* (2013.01); *H01L 21/02678* (2013.01); *H01L 21/02683* (2013.01); *H01L 21/268* (2013.01); *H01L 21/67115* (2013.01); *H01L 27/1274* (2013.01); *B23K 26/066* (2015.10); *B23K 26/127* (2013.01)

(56) References Cited

U.S. PATENT DOCUMENTS

| | | | | |
|---|---|---|---|---|
| 7,397,831 B2* | 7/2008 | Hongo | ............... | B23K 26/0738 |
| | | | | 257/E21.134 |
| 7,847,213 B1* | 12/2010 | Anikitchev | ............ | B23K 26/06 |
| | | | | 219/121.61 |
| 8,253,924 B2* | 8/2012 | Uehara | ............... | G03F 7/70258 |
| | | | | 355/53 |
| 2005/0169330 A1 | 8/2005 | Hongo et al. | | |
| 2013/0087547 A1 | 4/2013 | Hunter et al. | | |

FOREIGN PATENT DOCUMENTS

| | | |
|---|---|---|
| CN | 102095168 A | 6/2011 |
| CN | 102699529 A | 10/2012 |
| CN | 103915318 A | 7/2014 |
| JP | S58102530 A | 6/1983 |
| JP | 2001319877 A | 11/2001 |
| JP | 2005-147966 A | 6/2005 |

OTHER PUBLICATIONS

First Office Action, including Search Report, for Chinese Patent Application No. 201410099177.1, dated Feb. 14, 2016, 14 pages.
Extended Search Report from European Patent Application No. 14882176.2, dated Oct. 18, 2017, 7 pages.
International Search Report and Written Opinion, including English translation of Written Opinion, for PCT Application No. PCT/CN2014/095313, dated Apr. 3, 2015, 13 pages.
Rejection Decision for Chinese Patent Application No. 201410099177.1, dated Nov. 4, 2016, 12 pages.

* cited by examiner

LASER ANNEALING DEVICE, PRODUCTION PROCESS OF POLYCRYSTALLINE SILICON THIN FILM, AND POLYCRYSTALLINE SILICON THIN FILM PRODUCED BY THE SAME

This application is a Section 371 National Stage Application of International Application No. PCT/CN2014/095313, filed 29 Dec. 2014, entitled "LASER ANNEALING DEVICE, PRODUCTION PROCESS OF POLYCRYSTALLINE SILICON THIN FILM, AND POLYCRYSTALLINE SILICON THIN FILM PRODUCED BY THE SAME," which has not yet published, which claims priority to Chinese Application No. 201410099177.1, filed on 17 Mar. 2014, incorporated herein by reference in their entirety.

FIELD OF THE INVENTION

The invention relates to the technical field of laser annealing, in particular, to a laser annealing device, a production process of a polycrystalline silicon thin film, and a polycrystalline silicon thin film produced by the same.

BACKGROUND OF THE INVENTION

Among the flat panel display apparatuses, the active matrix organic light emitting diode (simply referred to as AMOLED) becomes an optimal choice of the display technique in the future due to advantages such as high image quality, short motion picture response time, low energy consumption, wide view angle, being ultralight and ultrathin, and the like. At present, in the technology of backplane of AMOLED, excimer laser annealing (simply referred to as ELA), solid phase crystallization, metal-induced crystallization, or the like is a mostly applied method for producing the polycrystalline silicon layer. The only method that has succeeded in industrial scale is to obtain the polycrystalline silicon thin film in the transistor active layer in the backplane by the excimer laser annealing process.

The excimer laser annealing process is a relatively complex annealing process. An ELA device is a device that irradiates an amorphous silicon film on a substrate with an excimer laser beam for a short time to produce a polycrystalline silicon film by the recrystallization of the amorphous silicon film. As shown in FIG. 1, which is a schematic diagram showing the construction of a laser annealing device in the prior art, the annealing device comprises a laser generator (not shown in FIG. 1), an annealing window 2, and two light-cutting plates 1 oppositely provided above the annealing window 2. One part of the laser beam emitted from the laser generator arrives at the amorphous silicon thin film 3 through the annealing window 2, while the other part is blocked and reflected back by the light-cutting plates 1. In the present specification, the end of the light-cutting plate, which reflects the laser beam, is referred to as the "light-cutting end". As shown in FIG. 1, the ingoing beam 40 arrives at the amorphous silicon thin film 3 through the annealing window 2. The incident beam 41 arriving at the light-cutting plates 1 is reflected by the light-cutting plates 1, so that reflected beams 42 are formed. The travel direction of the ingoing beam 40 and that of the incident beam 41 are substantially the same. Since the included angle formed by the reflecting surface of the light-cutting plate 1 and the incident beam 41 is close to a right angle, the included angle formed by the reflected beam 42 and the ingoing beam 40 is very small. Because the vibration direction of the reflected beam 42 and that of the ingoing beam 40 are similar, the phenomenon of interference will occur. This results in that there is interference mura on the produced polycrystalline silicon thin film. Such interference mura will affect the quality of the polycrystalline silicon. Meantime, in the manufacturing process, if interference mura on the polycrystalline silicon thin film occurs in succession, the percent of pass in the production process will finally decrease.

Therefore, the polycrystalline silicon thin film produced by the ELA device in the prior art can have interference mura, which results in the decrease of the percent of pass of the product.

SUMMARY OF THE INVENTION

The object of the invention is to provide a laser annealing device, a production process of a polycrystalline silicon thin film, and a polycrystalline silicon thin film produced by the same, in order to reduce interference mura on a polycrystalline silicon thin film, and furthermore, to improve the percent of pass of the product.

An embodiment of the invention provides firstly a laser annealing device comprising an annealing chamber, in which a laser generator is provided, wherein an annealing window, through which the laser passes, and two light-cutting plates oppositely provided above the annealing window are also provided in the annealing chamber, wherein a light-cutting end face of each of the light-cutting plates is a wedge-shaped end face.

In the present invention, a wedge-shaped end face indicates that the thickness exhibits a tend of increase from the side away from the main body of the light-cutting plate (i.e. the side of the light-cutting end) to the side close to the main body of the light-cutting plate, and the upper surface of the wedge-shaped end face (i.e. the surface irradiated by the laser) is provided slantwise, with respect to the plane, in which the annealing window lies. In technical solutions of the invention, since the light-cutting end face employs a wedge-shaped end face, whose sectional structure is similar to a nib, the included angle formed by the reflected beam, which is formed by the reflection of the incident beam arriving at the light-cutting end face, and the ingoing beam, which passes through the annealing window, is relatively large, and the vibration directions of them differ relatively greatly. Hence, the phenomenon of interference will hardly occur, and thus the interference mura generated on the polycrystalline silicon thin film due to the interference is reduced, the quality of the polycrystalline silicon thin film is improved, and the percent of pass of the product is also increased. Furthermore, the light-cutting plate employs a wedge-shaped end face, which results in that the contact point between the light-cutting plate and the annealing window below moves outwards, and thus the contact face between the light-cutting plate and the annealing window is reduced, the abrasion of the annealing window is weakened, and the life time of the annealing window is increased.

The wedge-shaped end face has various structures, such as a structure formed from the side faces of a prismoid, from two intersectant planes, or from other curved surfaces. Preferably, the wedge-shaped end face is two planes forming an included angle.

More preferably, the upper plane (i.e. the surface irradiated by the laser) in said two planes forming an included angle and the plane, in which the annealing window lies, form an included angle of 40 to 50 degrees. In the case that the upper plane and the plane, in which the annealing window lies, form an included angle of 40 to 50 degrees, the included angle formed by the incident light and the reflected light is about between 80 to 100 degrees. The vibration direction of the ingoing beam passing through the annealing window and that of the reflected beam are nearly perpendicular to each other. This effectively reduces the phenomenon of interference between the ingoing beam and the reflected beam, and thus the interference mura generated on the polycrystalline silicon thin film due to the interference is reduced, the quality of the polycrystalline silicon thin film is improved, and the percent of pass of the product is also increased.

Other wedge-shaped light-cutting end faces can also be used. Preferably, the wedge-shaped end face is a semielliptic cylinder or a parabolic cylinder. The wedge-shaped end face can also be a semicylinder. It is apparent that the wedge-shaped end face can also be in other forms, as long as the thickness exhibits a tend of increase from the side away from the main body of the light-cutting plate to the side close to the main body of the light-cutting plate.

For any of the laser annealing devices mentioned above, the laser generator can be an excimer laser.

Preferably, the excimer laser is a xenon chloride excimer laser, a krypton fluoride excimer laser or an argon fluoride excimer laser.

For any of the laser annealing devices mentioned above, the laser annealing device further comprises a supporter, which is positioned at the bottom of the annealing chamber, for supporting a substrate.

An embodiment of the invention also provides a production process of a polycrystalline silicon thin film, wherein the production process comprises forming an amorphous silicon thin film on a substrate; and subjecting the amorphous silicon thin film to laser annealing with any of the laser annealing devices mentioned above, so as to form a polycrystalline silicon thin film In the laser annealing device, the interference mura on the polycrystalline silicon thin film is reduced by modifying the shape of the end face of the light-cutting plate. The modification of the end face of the light-cutting plate is simple and costs very little. Polycrystalline silicon produced by this process is particularly suitable for the manufacture and production of low temperature poly-silicon (simply referred to as LTPS) AMOLED. This process effectively reduces the phenomenon of interference mura on polycrystalline silicon thin films, which tends to occur in the LTPS-AMOLED in the prior art.

Preferably, during the laser annealing, the impulse frequency of the laser is 500 Hz, the overlap ratio is 92% to 98%, the scanning speed of the laser is 4 mm/s to 16 mm/s, and the energy density of the laser is 300 to 500 mJ/cm$^2$.

An embodiment of the invention also provides a polycrystalline silicon thin film, wherein the polycrystalline silicon thin film is produced by any of the production processes mentioned above.

The polycrystalline silicon thin film produced by any of the production processes mentioned above can be used as an active layer of a polycrystalline silicon thin film transistor. It is applicable in the fields of low temperature poly-silicon thin film transistor liquid crystal displays (simply referred to as LTPS TFT-LCD), active matrix organic light emitting diode displays, and the like.

DESCRIPTION OF THE REFERENCE SIGN

1—light-cutting plate
2—annealing window
3—amorphous silicon thin film
11—light-cutting plate
40—ingoing beam
41—incident beam
42—reflected beam

DETAILED DESCRIPTION OF THE INVENTION

In the prior art, interference mura on a polycrystalline silicon thin film results in a relatively bad quality of the polycrystalline silicon thin film. In order to solve this technical problem, the invention provides a laser annealing device, a production process of a polycrystalline silicon thin film, and a polycrystalline silicon thin film produced by the same. In technical solutions of the invention, since the light-cutting end face is a wedge-shaped end face, the included angle formed by the reflected beam, which is formed by the reflection of the incident beam arriving at the light-cutting end face, and the ingoing beam, which passes through the annealing window, is relatively large, and the vibration directions of them differ relatively greatly. Hence, the phenomenon of interference will hardly occur, and thus the interference mura generated on the polycrystalline silicon thin film due to the interference is reduced, the quality of the polycrystalline silicon thin film is improved, and the percent of pass of the product is also increased. The invention will be described in more details by referring to Examples below, for making the purposes, technical solutions and advantages of the invention more clear.

Figure 1:
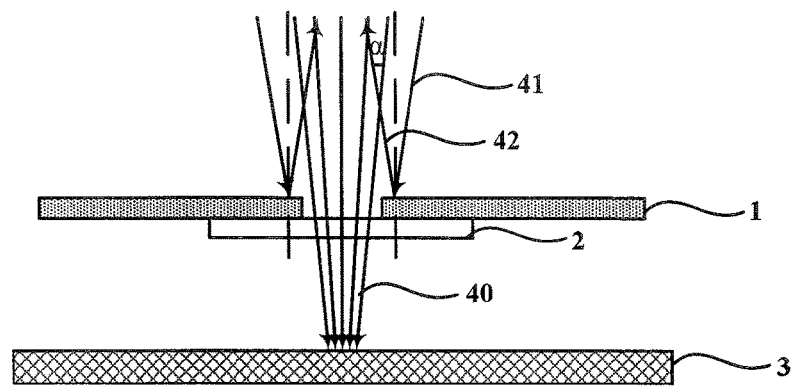
FIG. 1 is a schematic diagram showing the construction of a laser annealing device in the prior art.
Figure 2:
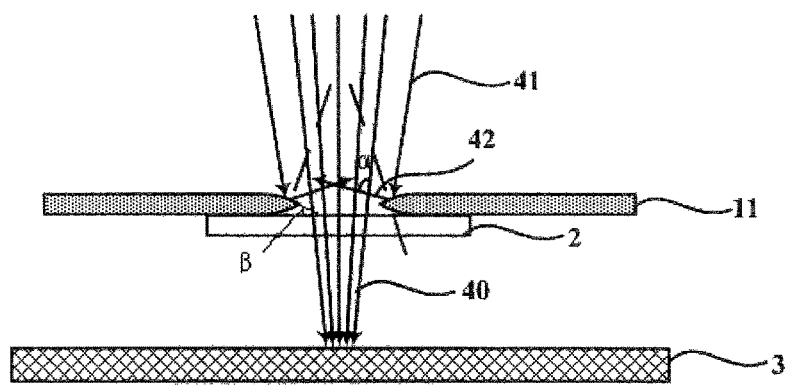
FIG. 2 is a schematic diagram showing the construction of a laser annealing device according to one embodiment of the invention.

An embodiment of the invention provides firstly a laser annealing device. As shown in FIG. 2, which is a schematic diagram showing the construction of a laser annealing device according to one embodiment of the invention, the laser annealing device comprises an annealing chamber, in which a laser generator (not shown in FIG. 2) is provided, wherein an annealing window 2, through which the laser passes, and two light-cutting plates 11 oppositely provided above the annealing window 2 are also provided in the annealing chamber, wherein the light-cutting end face of each of the light-cutting plates 11 is a wedge-shaped end face.

In the laser annealing device, the laser from the laser generator can arrive at the annealing window 2 and the light-cutting plate 11 after the laser beam has been adjusted by an optical system. Since the laser beam is nearly a parallel beam, the travel direction of the incident beam 41 arriving at the annealing window 2 and that of the ingoing beam 40 arriving at the light-cutting plate 11 are almost the same. In technical solutions of the invention, since the light-cutting end face employs a wedge-shaped end face, whose sectional structure is similar to a nib, the included angle formed by the reflected beam 42, which is formed by the reflection of the incident beam 41 arriving at the light-cutting end face, and the ingoing beam 40, which passes through the annealing window 2, is relatively large. Therefore, the vibration direction of the reflected beam 42 and that of the ingoing beam 40 differ relatively greatly. Hence, the phenomenon of interference will hardly occur, and thus the interference mura generated on the polycrystalline silicon thin film due to the interference is reduced, the quality of the polycrystalline silicon thin film is improved, and the percent of pass of the product is also increased. Furthermore, the light-cutting plate 11 employs a wedge-shaped end face, which results in that the contact point between the light-cutting plate and the annealing window 2 below moves outwards, and thus the contact face between the light-cutting plate 11 and the annealing window 2 is reduced, the abrasion of the annealing window 2 is weakened, and the life time of the annealing window 2 is increased. Because the annealing window 2 is an expensive consumable article, the maintenance costs of the laser annealing device are also reduced.

The wedge-shaped end face has various structures, such as a structure formed from the side faces of a prismo id, from two intersectant planes, or from other curved surface.

Again as shown in FIG. 2, it is preferred that the wedge-shaped end face is two planes forming an included angle. The two planes can be symmetrical with respect to a symmetry plane parallel to the upper face of the light-cutting plate 11. The two planes can also be asymmetrical, as long as the two planes form an included angle.

With continued reference to FIG. 2, it is preferred that the upper plane in the two planes forming an included angle and the plane, in which the annealing window 2 lies, form an included angle β of 40 to 50 degrees. In the case that the upper plane and the plane, in which the annealing window lies, form an included angle β of 40 to 50 degrees, the included angle a formed by the incident beam 41 arriving at the light-cutting end face of the light-cutting plate and the reflected beam 42 is about between 80 to 100 degrees. The vibration direction of the ingoing beam passing 40 through the annealing window and that of the reflected beam 42 are nearly perpendicular to each other. In particular, when the upper plane and the plane, in which the annealing window 2 lies, form an included angle β of 45 degrees, the incident beam 41 and the reflected beam 42 form an included angle of about 90 degrees, and the vibration direction of the ingoing beam 40 is nearly perpendicular to that of the reflected beam 42. This effectively reduces the phenomenon of interference between the ingoing beam 40 and the reflected beam 42, and thus the interference mura generated on the polycrystalline silicon thin film due to the interference is reduced, the quality of the polycrystalline silicon thin film is improved, and the percent of pass of the product is also increased.

In addition to the wedge-shaped light-cutting end face shown in FIG. 2, it is also possible to use other wedge-shaped light-cutting end faces. Preferably, the wedge-shaped end face is a semielliptic cylinder or a parabolic cylinder. The wedge-shaped end face can also be a semicylinder, or the like. It is apparent that the wedge-shaped end face can also be in other forms, as long as the height exhibits a tend of increase from the side away from the main body of the light-cutting plate 11 to the side close to the main body of the light-cutting plate 11.

For any of the laser annealing devices mentioned above, the laser generator can be an excimer laser.

Preferably, the excimer laser is a xenon chloride excimer laser, a krypton fluoride excimer laser or an argon fluoride excimer laser.

For any of the laser annealing devices mentioned above, the laser annealing device further comprises a supporter, which is positioned at the bottom of the annealing chamber, for supporting a substrate.

In the laser annealing devices mentioned above, a supporter for supporting a substrate can be provided. On the upper surface of the substrate, there is an amorphous silicon thin film 3, which forms a polycrystalline silicon thin film upon laser annealing.

Figure 3:
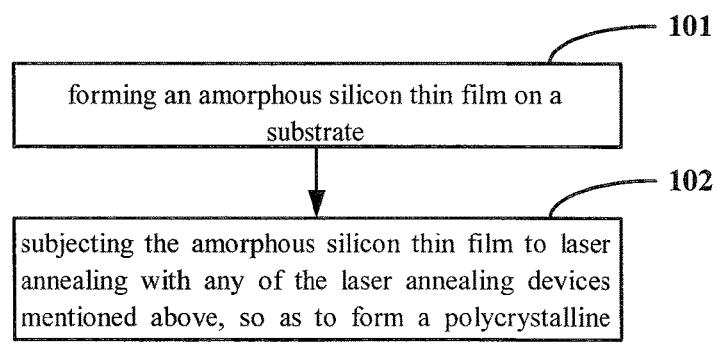
FIG. 3 is a schematic flow chart of the production process of a polycrystalline silicon thin film according to one embodiment of the invention.

An embodiment of the invention also provides a production process of a polycrystalline silicon thin film. As shown in FIG. 3, which is a schematic flow chart of the production process of a polycrystalline silicon thin film according to one embodiment of the invention, the production process comprises Step 101: forming an amorphous silicon thin film on a substrate; and Step 102: subjecting the amorphous silicon thin film to laser annealing with any of the laser annealing devices mentioned above, so as to form a polycrystalline silicon thin film.

In the laser annealing device, the interference mura on the polycrystalline silicon thin film is reduced by modifying the shape of the end face of the light-cutting plate and designing the end face of the light-cutting plate as a wedged-shaped end face. The modification of the end face of the light-cutting plate is simple and costs very little. Polycrystalline silicon produced by this process is particularly suitable for the manufacture and production of LTPS-AMOLED. This process effectively reduces the phenomenon of interference mura on polycrystalline silicon thin films, which tends to occur in the LTPS-AMOLED in the prior art.

Preferably, during the laser annealing, the impulse frequency of the laser is 500 Hz, the overlap ratio is 92% to 98%, the scanning speed of the laser is 4 mm/s to 16 mm/s, and the energy density of the laser is 300 to 500 mJ/cm$^2$.

In the production processes mentioned above, laser parameters is designed to allow better conversion of the amorphous silicon thin film into the polycrystalline silicon thin film. The laser parameters can be designed for excimer lasers.

In any of the production processes mentioned above, before the amorphous silicon thin film is formed on the substrate, the process further comprises forming a silicon nitride layer on the substrate and forming a silica layer on the silicon nitride layer. The amorphous silicon thin film is positioned on the silica layer.

An embodiment of the invention also provides a polycrystalline silicon thin film, wherein the polycrystalline silicon thin film is produced by any of the production processes mentioned above.

The polycrystalline silicon thin film produced by any of the production processes mentioned above can be used as the active layer of the polycrystalline silicon thin film transistor. It is applicable in the fields of LTPS TFT-LCD, active matrix organic light emitting diode displays, and the like. Said displays can be liquid crystal display apparatuses, TVs, computers, cellphones, and the like.

Next, the production process of the polycrystalline silicon thin film will be described by a preferable example. The invention is not limited by the example below. The excimer laser used in the invention can be a xenon chloride excimer laser, a krypton fluoride excimer laser, an argon fluoride excimer laser, or the like. In this example, a xenon chloride excimer laser with a wavelength of 308 nm was used.

A specific process for producing the low temperature polycrystalline silicon thin film in the invention is as follows.

Step 1) The underlaid substrate is pre-washed. The underlaid substrate can be a glass underlaid substrate.

Step 2) A thin film layer is produced on the underlaid substrate. The thin film top layer is an amorphous silicon layer. An example of the specific production process of the thin film layer is as follows. A buffer layer comprising a silicon nitride ($SiN_x$) layer and a silicon dioxide ($SiO_2$) layer on the silicon nitride layer is formed. In particular, the buffer layer can be deposited by the plasma enhanced chemical vapor deposition (simply referred to as PECVD). The thickness of the silicon nitride layer deposited can range from 50 to 150 nm. The thickness of the silica layer deposited can range from 100 to 350 nm. After the buffer layer is formed, an amorphous silicon layer is formed on the buffer layer. Also, the deposition can be performed by a PECVD process. The thickness of the amorphous silicon layer deposited can range from 30 to 60 nm. After the deposition of the amorphous silicon layer is finished, the amorphous silicon is subjected to heat treatment at a temperature of 400 to 500° C. for 0.5 to 3 hours.

Step 3) After the heat treatment, the substrate having the amorphous silicon layer produced thereon is placed in the annealing chamber of any of the laser annealing devices mentioned above. Excimer laser annealing is applied. The excimer laser beam arrives at the light-cutting plate having the wedge-shaped end face, where the laser beam is "cut" and becomes a narrow one with an applied width. Then the cut laser beam passes the annealing window and irradiates the amorphous silicon layer. Thereafter, the scanning of the excimer laser annealing is performed. During the laser annealing, relevant parameters can be designed as follows: the impulse frequency of the laser being 500 Hz, the overlap ratio being 92% to 98%, the scanning speed of the laser being 4 mm/s to 16 mm/s, and the energy density of the laser being 300 to 500 $mJ/cm^2$.

The polycrystalline silicon thin films produced by means of the light-cutting plate in the prior art, which has the shape of a flat sheet, have stripe-like interference mura at the region where the edge of the laser beam irradiates the polycrystalline silicon thin film, as observed with a microscope. However, the polycrystalline silicon thin film substrates produced by the process mentioned above do not exhibit interference mura. In this process, the excimer laser beam passes through the light-cutting plates having a light-cutting end face of wedge-shaped light-cutting end face. The included angle formed by the vibration direction of the ingoing beam and that of the outcoming beam is relatively large, which effectively prevents the phenomenon of interference between the ingoing beam and reflected beam, thereby preventing the interference mura that is generated in the polycrystalline silicon thin film on the substrate due to interference. Further, the contact point between the light-cutting plate having a wedge-shaped end face and the annealing window below moves outwards, and thus the abrasion of the annealing window is weakened, and the life time of the annealing window is increased.

It is apparent that various modifications and variations may be made by those skilled in the art, without departing from the spirit and scope of the invention. Thus, if these modifications and variations fall within the range of the claims of the invention and equivalent techniques thereof, it is intended that these modifications and variations are included in the present invention.

What is claimed is:

1. A laser annealing device comprising an annealing chamber, in which a laser generator is provided, wherein
    an annealing window, through which the laser passes downwardly, and
    two light-cutting plates oppositely provided above the annealing window are also provided in the annealing chamber, wherein a light-cutting end face of each of the light-cutting plates is a wedge-shaped end face, wherein:
    the wedge-shaped end face is built by two planes forming an included angle, wherein the upper plane in the two planes forming the included angle and the plane, in which the annealing window lies, form an included angle 40 to 50 degrees; or
    the wedge-shaped end face is a semicylinder, a semielliptic cylinder or a parabolic cylinder,
    wherein the laser, which is to be cut by the light-cutting plates, is a substantially parallel beam and substantially perpendicular to the annealing window.

2. The laser annealing device as claimed in claim 1, wherein the laser generator is an excimer laser.

3. The laser annealing device as claimed in claim 2, wherein the excimer laser is a xenon chloride excimer laser, a krypton fluoride excimer laser or an argon fluoride excimer laser.

4. The laser annealing device as claimed in claim 1, wherein the laser annealing device further comprises a supporter, which is positioned at the bottom of the annealing chamber, for supporting a substrate.

5. A production process of a polycrystalline silicon thin film, wherein the production process comprises
    forming an amorphous silicon thin film on a substrate; and
    subjecting the amorphous silicon thin film to laser annealing with the laser annealing device as claimed in claim 1, so as to form a polycrystalline silicon thin film.

6. A production process as claimed in claim 5, wherein during the laser annealing, the impulse frequency of the laser is 500 Hz, the overlap ratio is 92% to 98%, the scanning speed of the laser is 4 mm/s to 16 mm/s, and the energy density of the laser is 300 to 500 $mJ/cm^2$.

7. A polycrystalline silicon thin film, wherein the polycrystalline silicon thin film is produced by the production process as claimed in claim 5.

* * * * *